(12) United States Patent
Liu et al.

(10) Patent No.: US 10,163,896 B2
(45) Date of Patent: Dec. 25, 2018

(54) INTEGRATED CIRCUIT HAVING A MOM CAPACITOR AND METHOD OF MAKING SAME

(71) Applicant: Taiwan Semiconductor Manufacturing Company, Ltd., Hsin-Chu (TW)

(72) Inventors: Chi-Wen Liu, Hsin-Chu (TW); Chao-Hsiung Wang, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/132,001

(22) Filed: Apr. 18, 2016

(65) Prior Publication Data

US 2016/0233213 A1 Aug. 11, 2016

Related U.S. Application Data

(62) Division of application No. 13/289,666, filed on Nov. 4, 2011, now Pat. No. 9,318,431.

(51) Int. Cl.
*H01L 29/94* (2006.01)
*H01L 27/06* (2006.01)
(Continued)

(52) U.S. Cl.
CPC ...... *H01L 27/0629* (2013.01); *H01L 23/5223* (2013.01); *H01L 27/1203* (2013.01); *H01L 27/1211* (2013.01); *H01L 28/40* (2013.01); *H01L 28/60* (2013.01); *H01L 28/90* (2013.01); *H01L 29/94* (2013.01); *H01L 2924/0002* (2013.01)

(58) Field of Classification Search
CPC .................................................. H01L 23/5223
See application file for complete search history.

(56) References Cited

U.S. PATENT DOCUMENTS 5,502,320 A * 3/1996 Yamada ............ H01L 27/10823
257/301
7,312,492 B2 12/2007 Schwerin
(Continued)

FOREIGN PATENT DOCUMENTS

CN 102446974 5/2012
CN 103094362 A 5/2013
(Continued)

OTHER PUBLICATIONS

Yoo, A; "A Low-Voltage Lateral SJ-FINFET with Deep-Trench p-Drift Region," Samsung Electron Co., Ltd., Giheung, South Korea; Onish, Y.; Xu, E.; Ng. J.C.W., vol. 30, Issue 8, Date of Publication Jul. 10, 2009.

*Primary Examiner* — Bilkis Jahan
(74) *Attorney, Agent, or Firm* — Slater Matsil, LLP

(57) ABSTRACT

An integrated circuit can include a MOM capacitor formed simultaneously with other devices, such as finFETs. A dielectric layer formed on a substrate has a first semiconductor fin therein and a second semiconductor fin therein. Respective top portions of the fins are removed to form respective recesses in the dielectric layer. First and second electrodes are formed in the recesses. The first and second electrodes and the interjacent dielectric layer form a MOM capacitor.

20 Claims, 22 Drawing Sheets

(51) Int. Cl.
*H01L 23/522* (2006.01)
*H01L 27/12* (2006.01)
*H01L 49/02* (2006.01)

(56) References Cited

U.S. PATENT DOCUMENTS

| | | | |
|---|---|---|---|
| 7,497,958 B2* | 3/2009 | Sandhu | B82Y 10/00 216/2 |
| 2005/0253267 A1 | 11/2005 | Takao | |
| 2006/0006446 A1* | 1/2006 | Schwerin | H01L 27/10876 257/308 |
| 2007/0080387 A1 | 4/2007 | Liu et al. | |
| 2008/0173913 A1* | 7/2008 | Kojima | H01L 27/1203 257/296 |
| 2009/0315092 A1 | 12/2009 | Mikasa | |
| 2010/0078695 A1 | 4/2010 | Law et al. | |
| 2010/0123214 A1 | 5/2010 | Chen et al. | |
| 2010/0279497 A1 | 11/2010 | Lee | |
| 2011/0068405 A1 | 3/2011 | Yuan et al. | |
| 2011/0095372 A1 | 4/2011 | Yuan et al. | |
| 2011/0143509 A1 | 6/2011 | Fujimoto | |
| 2012/0091538 A1 | 4/2012 | Lin et al. | |

FOREIGN PATENT DOCUMENTS

| | | |
|---|---|---|
| JP | 02090561 | 3/1990 |
| KR | 20110033039 A | 3/2011 |
| KR | 20110049679 A | 5/2011 |

\* cited by examiner

INTEGRATED CIRCUIT HAVING A MOM CAPACITOR AND METHOD OF MAKING SAME

PRIORITY CLAIM AND CROSS-REFERENCE

This application claims the benefit to and is a divisional of U.S. patent application Ser. No. 13/289,666, filed on Nov. 4, 2011, and entitled "Integrated Circuit Having a MOM Capacitor and Method of Making Same" which application is incorporated herein by reference.

BACKGROUND

Fin field effect transistor (FinFET) devices represent a next step in the continuous evolution of semiconductor transistor technology. As contrasted to conventional planar transistors, finFET devices raise numerous issues relating to integration with other circuit devices in order to improve device performance and surface area utilization efficiency.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
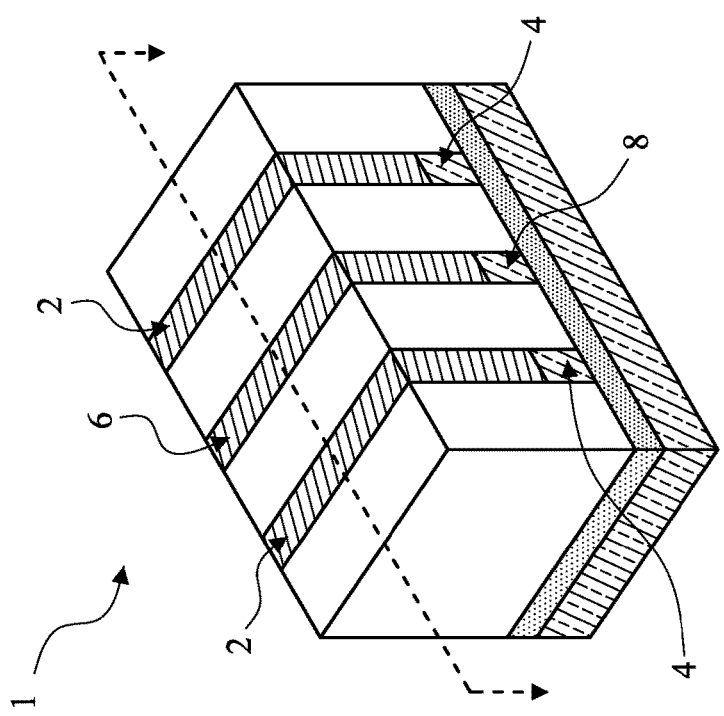
FIGS. 1a, 1b, and 1c illustrate in perspective view, cross-sectional view, and top view, respectively, an illustrative embodiment MOM capacitor structure.
Figure 1B:
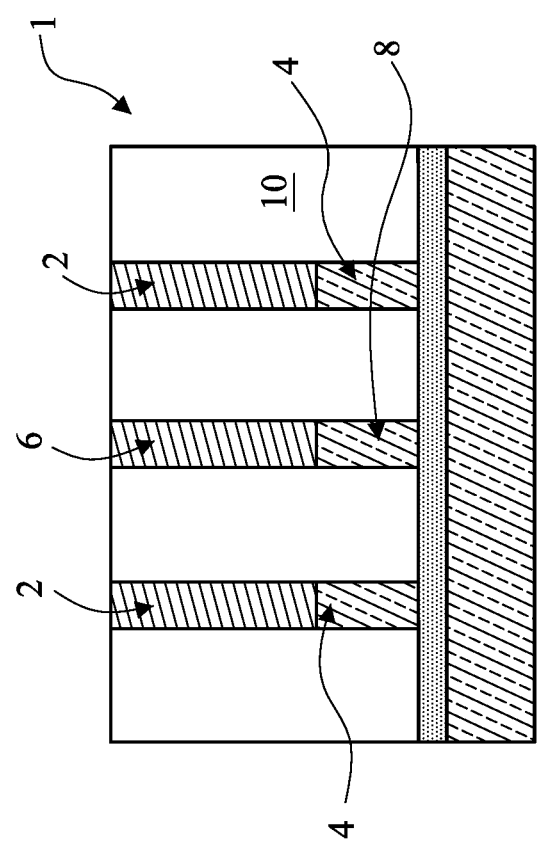
Figure 1C:
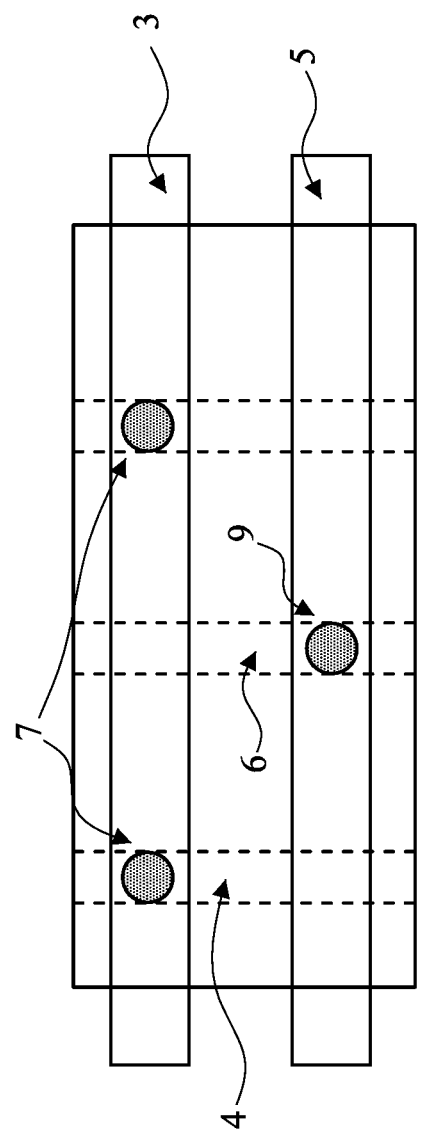

FIG. 1a represents in perspective view a first embodiment metal oxide metal (MOM) capacitor structure 1 formed using fin field effect transistor (finFET) technology and structures. FIG. 1b represents MOM capacitor 1 in cross-sectional view through the line indicated in FIG. 1a.

MOM capacitor 1 includes a first electrode 2 and a second electrode 6. First electrode 2 is formed atop a first fin structure 4 and second electrode 6 is formed atop a second fin structure 8. Dielectric material 10, providing the capacitor dielectric function, is formed between first electrode 2 and second electrode 6. In this way a MOM capacitor is formed of first electrode 2, dielectric material 10, and second electrode 6. In the illustrated embodiment, MOM capacitor 1 has two first electrodes 2 formed atop two respective first fin structures 4. This is a design choice, and one skilled in the art will recognize a number of alternative embodiments, including two or more first electrodes, two or more second electrodes, a single first electrode, and single second electrode, and the like, all of which fall within the contemplated scope of the present disclosure.

First fin structure 4 and second fin structure 8 are formed atop a major surface of semiconductor-on-insulator (SOI) substrate in the illustrated embodiment. The substrate includes a bulk layer 12 (see FIGS. 2a and 2b), such as silicon or other semiconductor material, on which is formed SOI dielectric layer 14 (see FIGS. 2a and 2b). SOI dielectric layer 14 may be silicon oxide, for example. In other embodiments, other materials may be used for bulk layer 12 and SOI dielectric layer 14. Electrical contacts 3, 5 are formed contacting first electrode 2 and second electrode 6, respectively. In some embodiments, contacts 3, 5 are formed overlying electrodes 2, 6 and make electrical contact to the respective electrodes by way of vias 7, 9 respectively, as is known in the art.

Figure 11:
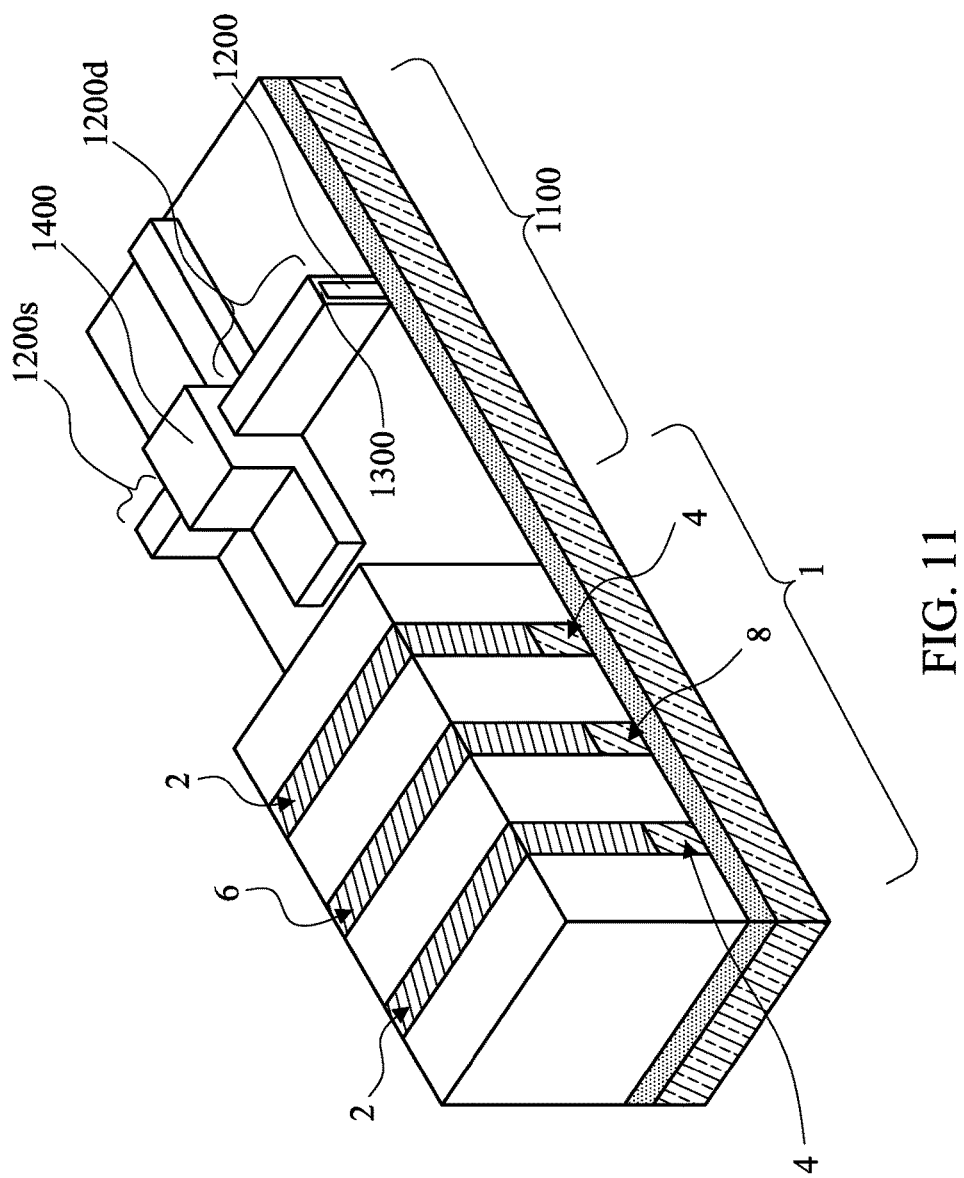
FIG. 11 illustrates in perspective view an illustrative embodiment MOM capacitor structure and an illustrative embodiment finFET device.

The MOM structure illustrated in FIGS. 1a and 1b provides the advantage that the structure may be formed simultaneously with a finFET device, without the need for additional manufacturing steps. This is illustrated in the example of FIG. 11 where an illustrative embodiment finFET device 1100 is formed simultaneously with the MOM capacitor structure 1. One skilled in the art will recognize that counter-part structures to fins 4 and 8 (e.g. a counter-part third semiconductor fin 1200) may be formed simultaneously with fins 4 and 8, doped to have a source and drain formed therein (e.g. source region 1200s and drain region 1200d of third semiconductor fin 1200), and covered with a gate oxide (e.g. gate oxide 1300 covering third semiconductor fin 1200) and a gate electrode (e.g. gate electrode 1400 covering a portion of the third semiconductor fin 1200). This may reduce manufacturing costs and complexity and increase manufacturing yield. Another advantageous feature of the illustrated embodiment is that the MOM capacitor structure 1, by utilizing thin fin structures 4 and 8, is compact and provides for efficient space utilization.

Figure 2A:
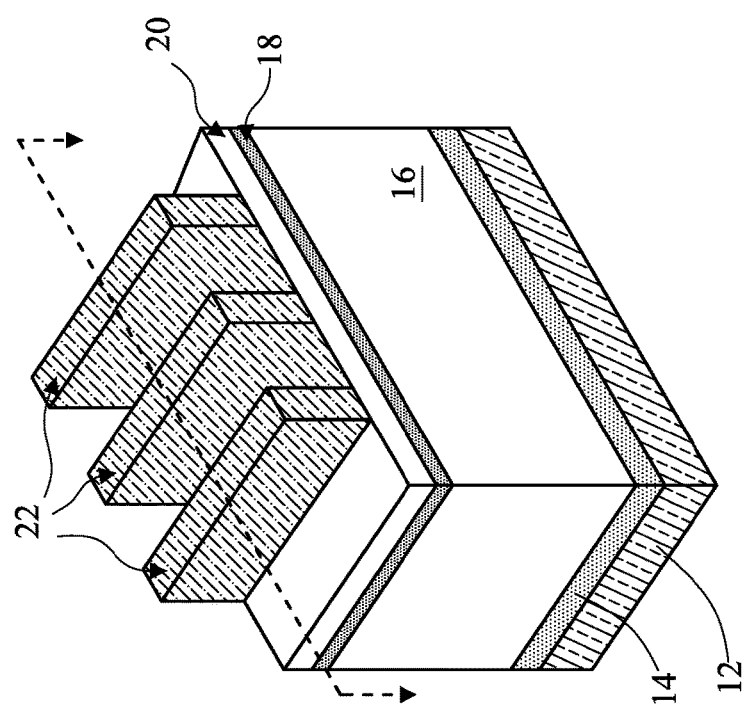
FIGS. 2a through 7b illustrate steps in the manufacture of the structure illustrated in FIGS. 1a and 1b.

An illustrative embodiment process for manufacturing MOM capacitor 1 will now be provide with reference to FIGS. 2a through 7b. FIG. 2a illustrates in perspective view and FIG. 2b illustrates in cross-sectional view an intermediate phase in the manufacture of MOM capacitor 1. An SOI substrate comprising bulk layer 12, SOI dielectric layer 14, and semiconductor layer 16 is provided. The details of an SOI substrate and the manufacture thereof are well known, and hence are not included herein for the sake of brevity and clarity. As will be apparent to those skilled in the art, semiconductor layer 16 is the layer in which will be formed, e.g., first fin structure 4 and second fin structure 8, as illustrated in FIGS. 1a and 1b, and as discussed further in the following description.

Figure 2B:
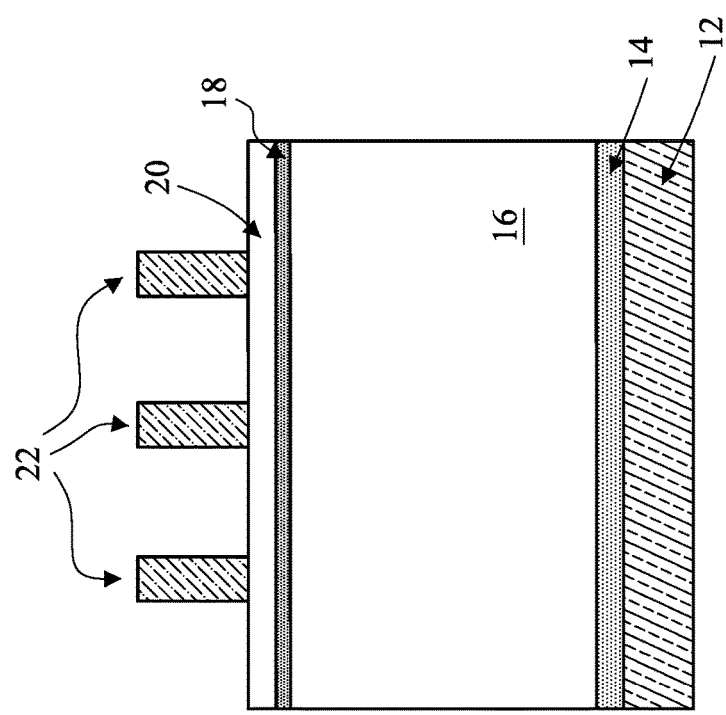

Pad oxide 18 and hard mask 20 are formed atop semiconductor layer 16 using known techniques. Pad oxide 18 may be, for instance, a thermally grown or chemical vapor deposition (CVD) deposited silicon oxide layer. Hard mask 20 may be, as an example, a silicon nitride layer. Other materials may be used as well. Also illustrated in FIGS. 2a and 2b is photo-sensitive layer 22. In the stage of manufacturing illustrated in FIG. 2, photo-sensitive layer 22 has been patterned using known mask and photolithography techniques. Photo-sensitive layer may be a photo-sensitive polymer, such as a photoresist material typically employed in the manufacture of integrated circuits.

Figure 3A:
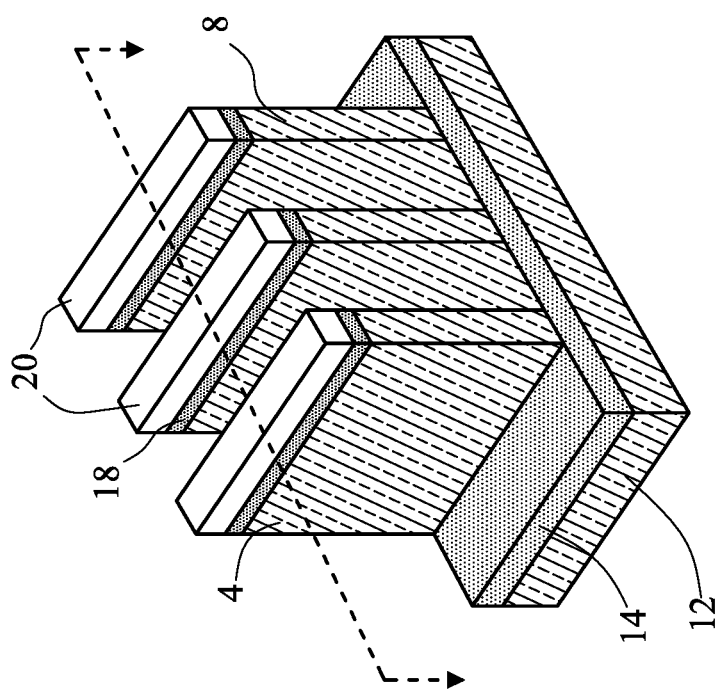
Figure 3B:
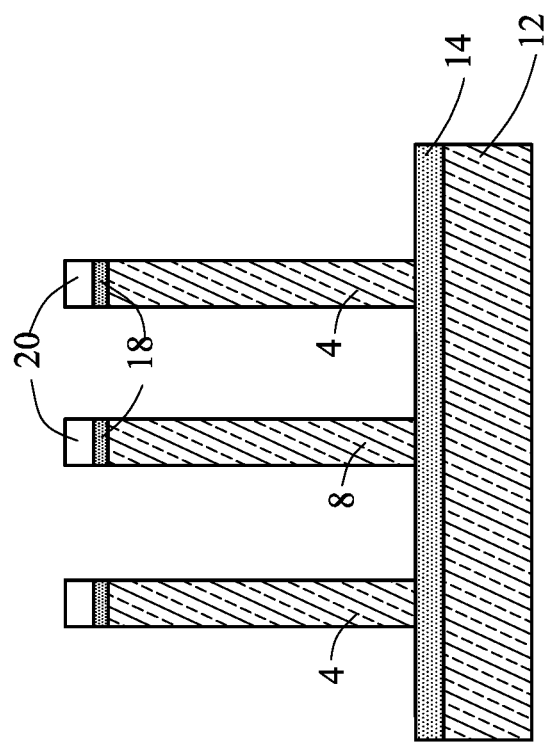

The purpose of hard mask 20 and pad oxide 18 is to provide for the faithful reproduction of a pattern from patterned photo-sensitive layer 22 into underlying semiconductor layer 16, while at the same time protecting the upper surface of semiconductor layer 16 during the etch process. The result of this reproduction is the formation of fin structures 4 and 8, as illustrated in FIG. 3 (which includes FIGS. 3a and 3b). As shown, the pattern of photosensitive layer 22 is transferred to semiconductor layer 16 using well known etch process, such as an anisotropic plasma etch process for form fin structures in semiconductor layer 16.

One skilled in the art will recognize numerous processes that are sufficient for the etching of semiconductor layer 16 using routine experimentation; hence the details of the etch process are not discussed herein.

It should be noted that the process of etching a pattern into semiconductor layer 16 is also employed in the formation of finFET devices. Hence, it is contemplated that in some embodiments, semiconductor layer 16 will be patterned in a first region to form fin structures for a resulting MOM capacitor (such as illustrated in FIG. 3), while simultaneously, semiconductor layer 16 will be patterned in a second region to form fin structures for a resulting finFET device (not shown in FIG. 3). Likewise, unless specifically excluded herein, each of the following process steps can be performed simultaneously with process steps to concurrently form a finFET device. Note that in the case illustrated in FIG. 3 the etching process completely removes photosensitive layer 22. Alternatively, remaining portions of photo-sensitive layer 22 can be removed by ashing, an ozone plasma, or other known techniques for removing residual photosensitive materials. In other embodiments, residual photo-sensitive material can be removed in a subsequent processing step.

Figure 4A:
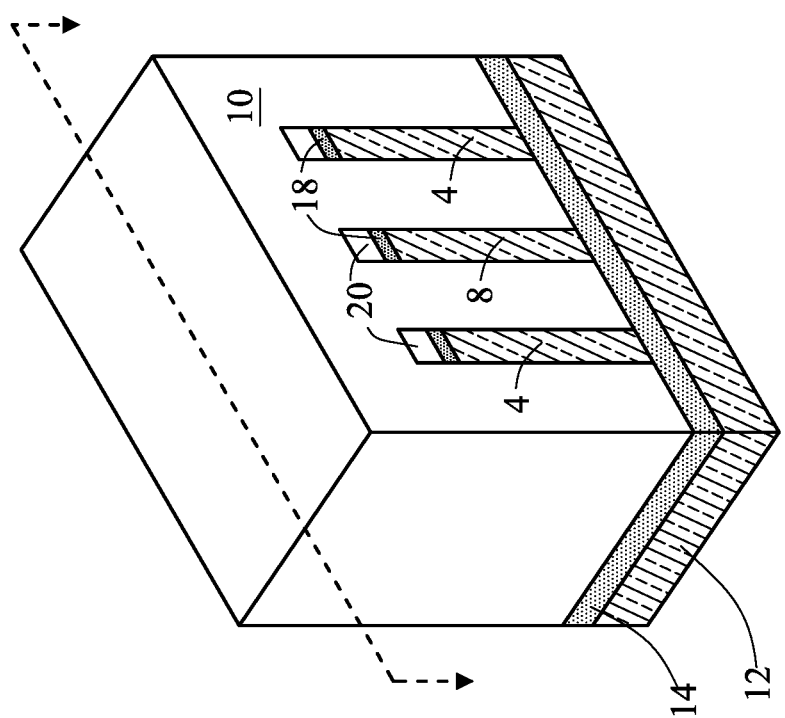
Figure 4B:
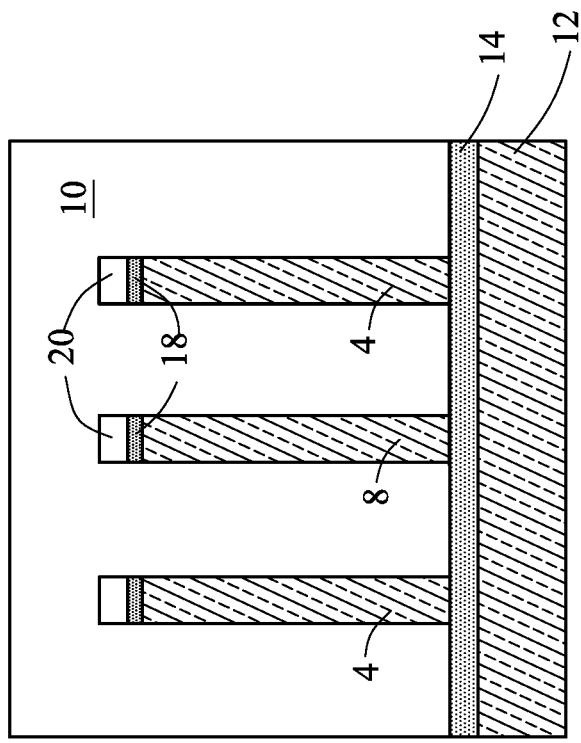

Dielectric material 10 is next formed, as illustrated in FIG. 4 (which includes FIG. 4a and FIG. 4b). In an intermediate stage of manufacture, as shown in FIG. 4, dielectric material 10 completely surrounds the fin structures 4 and 8. Dielectric material 10 may be a silicon oxide material formed by CVD, PVD, and the like, or a high-k material formed by CVD, PVD, ALD, and the like. In some embodiments, dielectric material 10 may be referred to as shallow trench isolation (STI) dielectric, in reference to the known materials and process steps for forming STI dielectrics. In embodiments wherein fin structures (such as finFETs and MOM capacitor 1) are formed simultaneously with planar devices (such as planar transistors, for instance), dielectric material 10 may be formed simultaneously with shallow trench isolation for the planar devices.

Figure 5A:
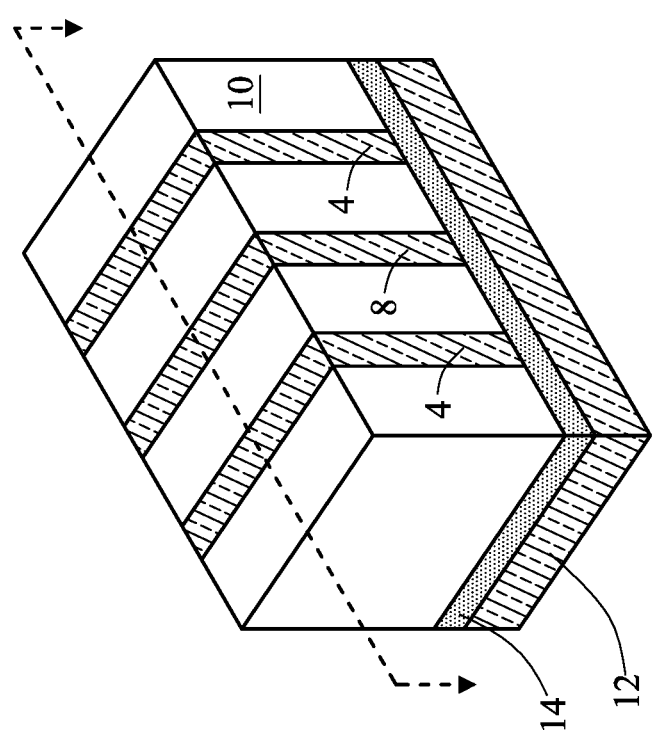
Figure 5B:
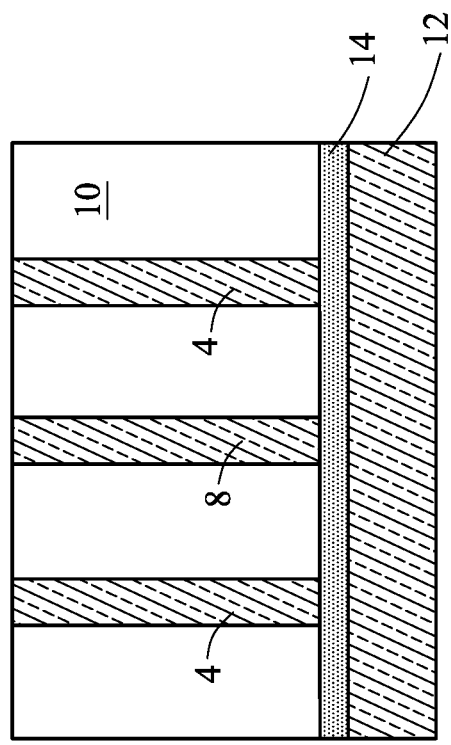

FIG. 5a illustrates in perspective view and FIG. 5b illustrates in cross-sectional view the results of a planarizing process performed on the structure. In particular, dielectric material 10 is planarized and its top surface brought level to the top surface of the fin structures 4, 8. In this process, any residual photo-sensitive layer 22, as well as any remaining portions of hard mask 20 and pad oxide 18 may also be removed. In some embodiments, dielectric material 10 is planarized using a chemical mechanical polish (CMP) process. In other embodiments, dielectric material 10 may be planarized using an etch-back process, as will be apparent to those skilled in the art. As illustrated in FIG. 5, the top surfaces of fin structures 4, 8 are now exposed.

Figure 6A:
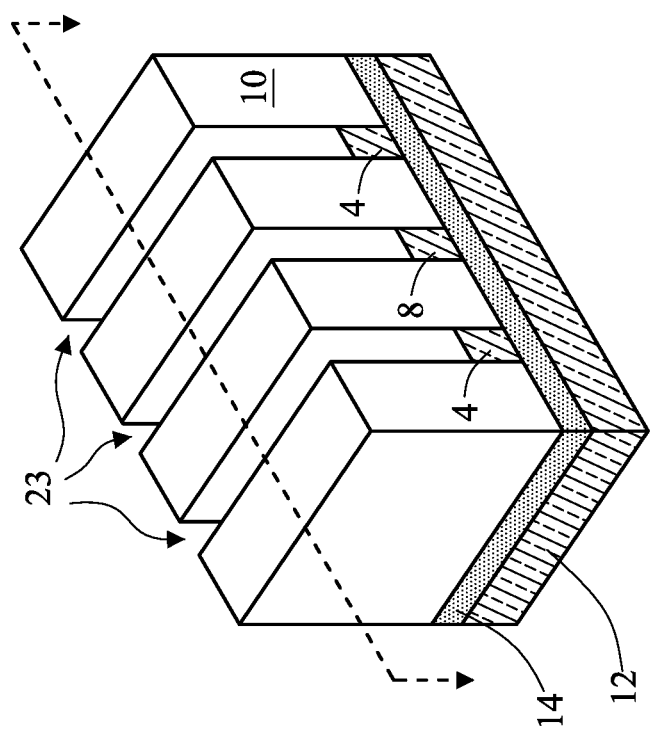
Figure 6B:
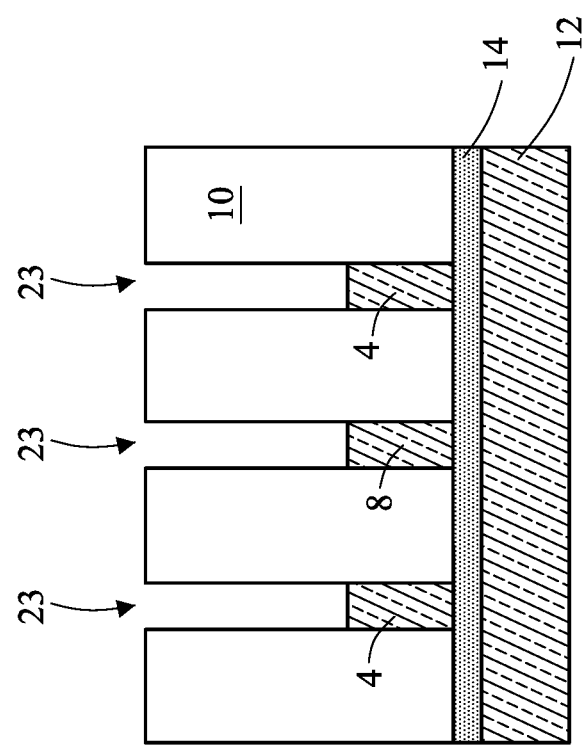

In a next process step, fin structures 4, 8 are recessed back, as illustrated in FIGS. 6a and 6b, which illustrate the resulting structure in perspective view and cross-sectional view, respectively. As an example, fin structures 4, 8 are originally formed having a height (i.e. extending above the surface of SOI dielectric layer) of from about 600 nm to about 1200 nm. After the recess process, fin structures 4, 8 have a height of from about 300 nm to about 500 nm. This recess process can be performed in a variety of ways. In an illustrative embodiment, fin structures 4, 8 are recessed back by, for instance, a dry etch process. The etching process may be performed under a pressure of from about 1 mTorr to about 1000 mTorr, a power of from about 50 W to about 1000 W, a bias voltage of from about 20 V to about 500 V, and at a temperature of from about 40° C. to about 60° C., using, e.g., HBr and/or $Cl_2$ as etch gases.

Figure 7A:
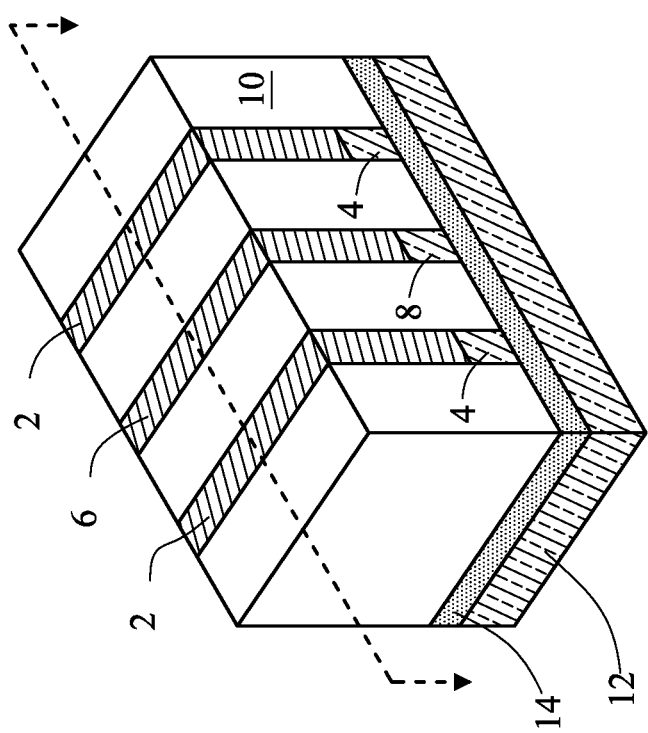
Figure 7B:
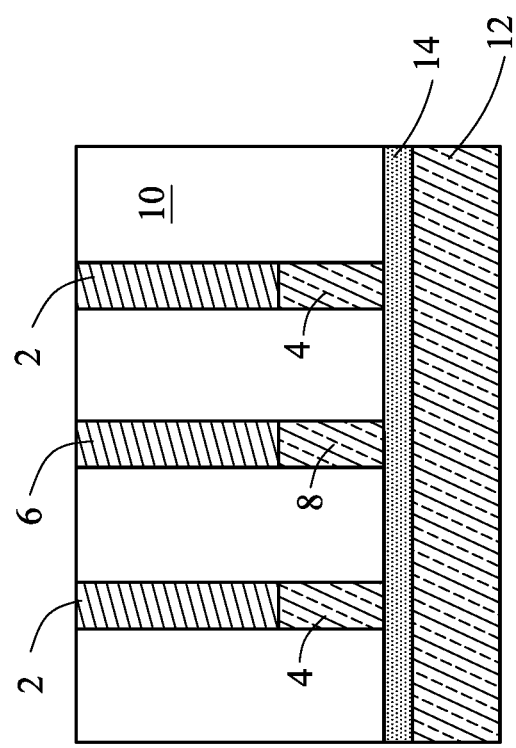

First electrode 2 and second electrode 6 are next formed, as illustrated in perspective view by FIG. 7a and cross-sectional view by FIG. 7b. As shown, the recesses 23 in dielectric material 10 that result from the etch process on fin structure 4, 8 are filled with a conductive material for forming first electrode 2 and second electrode 6. The electrodes may be formed of a suitable conductive material, such as aluminum, copper, tungsten, titanium, a metal silicide, a conductive ceramic, doped silicon, or the like. In some embodiments, one or more barrier and/or seed layers may be formed along the bottom and sidewalls of recesses 23 prior to forming the conductive electrode material. For instance a barrier layer of one or more sub-layers of titanium and titanium nitride may be formed in recesses 23 prior to forming, e.g., a tungsten conductive electrode. Alternatively, electrodes could be formed of highly doped and silicided polysilicon material. In yet other embodiments, a thin seed layer could be formed in recesses 23 prior to forming the electrodes using an electroplating or electroless plating technique.

Other techniques for forming electrodes 2 and 6 will be apparent to those skilled in the art. These include but are not limited to chemical or vapor deposition, sputter deposition, plating, and the like. As shown in FIG. 7, first electrode 2 and second electrode 6 have top surfaces that are level with, or co-terminus with, the top of dielectric material 10. This may be accomplished by careful control of the deposition process. Alternatively, conductive material could be formed so as to overlie the top surface of dielectric material 10, followed by a CMP (or etch back) process to planarize the conductive material and bring it level with dielectric material 10, thus forming electrodes 2 and 6. As noted previously, additional process steps, such as the formation of contacts to electrodes 2, 6 may be performed to electrically couple MOM capacitor 1 to other circuit elements, to gang multiple first electrodes 2, or second electrodes 6, together, and the like.

Figure 8A:
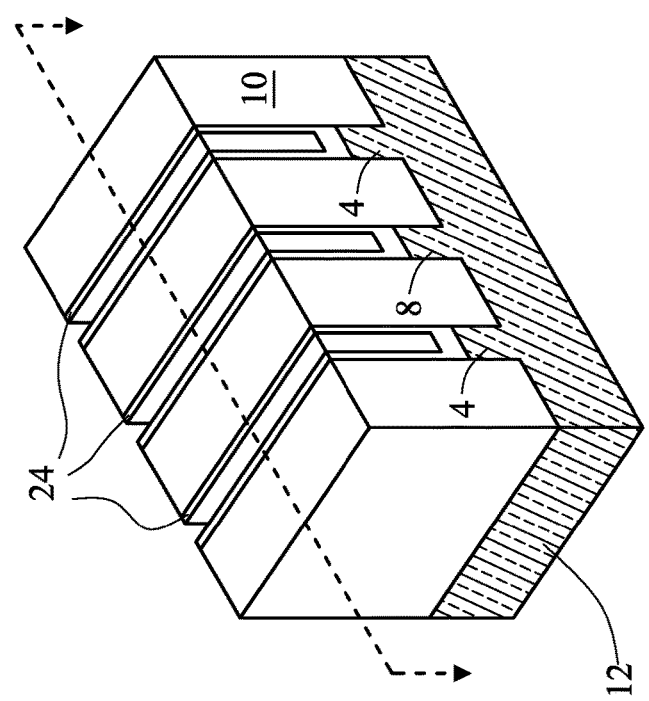
FIGS. 8a through 9b illustrates steps in the manufacture of a second illustrative embodiment MOM capacitor.
Figure 8B:
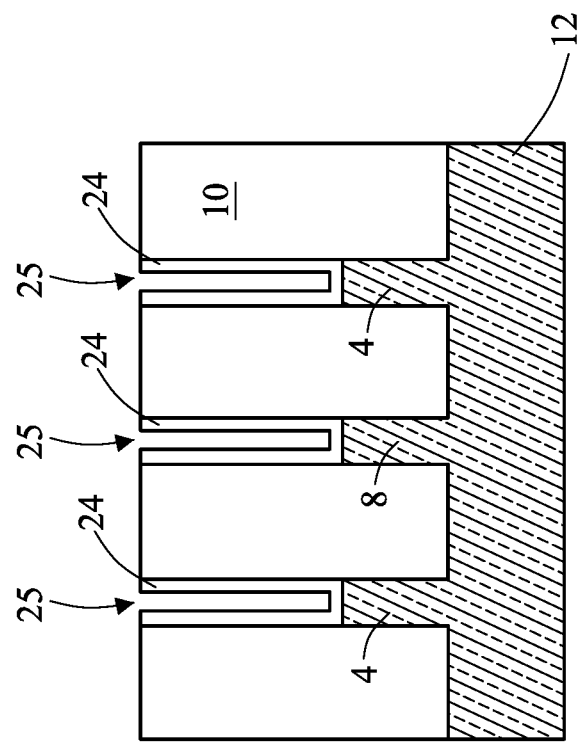

A second illustrative embodiment MOM capacitor is illustrated in perspective view in FIG. 8a and cross-sectional view in FIG. 8b. This second embodiment could also be employed using a SOI substrate, but is particularly advantageous for using a bulk substrate 12, as illustrated in FIGS. 8a and 8b. The second embodiment is manufactured using the similar processes illustrated in FIGS. 2a through 6b, albeit with a bulk substrate 12 rather than an SOI substrate. The manufacturing process diverges from that process for the first illustrative embodiment at this stage, however. In the second embodiment, recesses 23 (illustrated in FIGS. 6a and 6b) are partially, but not completely, filled with a liner dielectric layer 24. This is accomplished by forming the liner dielectric layer 24 on the bottom and sidewalls of the recesses in dielectric material 10. In this way, the subsequently formed electrodes are electrically isolated from bulk substrate 12, thus avoiding undesirable current paths through the substrate.

In an illustrative embodiment, recesses 23 have a width of from about 5 to about 30 nm, corresponding to the thickness of fin structures 4, 8. Liner dielectric material 24 may comprise silicon oxide, a high-k dielectric comprising a metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. Liner material 24 is formed to a thickness of from about 5 nm to about 15 nm, as an example, on the sidewalls and bottom of the recess. Liner dielectric material 24 can be formed in recesses 23 by, e.g., thermal oxidation for a silicon oxide, or a CVD or similar process for a high-k dielectric.

Figure 9A:
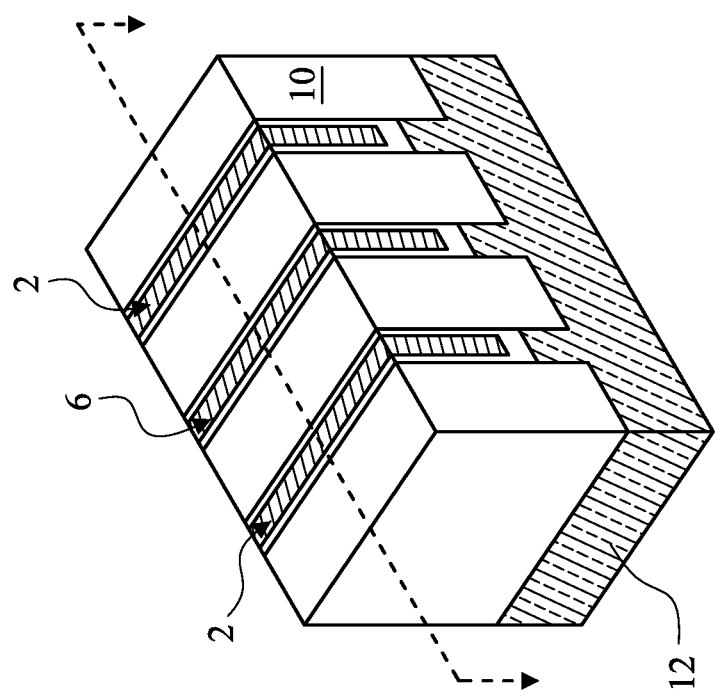

Because liner dielectric material 24 only partially fills recesses 23, recesses 25 remain after formation of liner dielectric material 24, as best illustrated in FIG. 8b. These recesses are thin filled with a conductive material, as illustrated in FIGS. 9a (perspective view) and 9b (cross-sectional view), thus forming first electrode 2 and second electrode 6. Illustrative materials and processes for forming electrodes 2 and 6 were discussed above with reference to FIGS. 7a and 7b, and hence are not repeated herein for the sake of brevity and clarity.

Figure 9B:
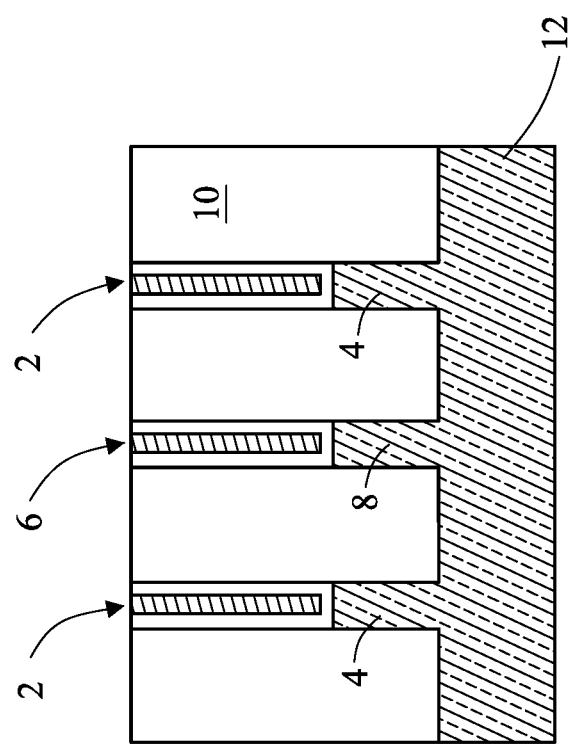

An advantageous feature of the embodiment illustrated in FIGS. 9a and 9b is the introduction of the additional dielectric material, i.e. liner dielectric material 24, allows for one to better engineer the capacitance value of the resulting MOM structure, by careful design of the material and thickness of liner dielectric material 24. Other advantageous features include the ability to form capacitors and transistors using the same process steps.

Figure 10A:
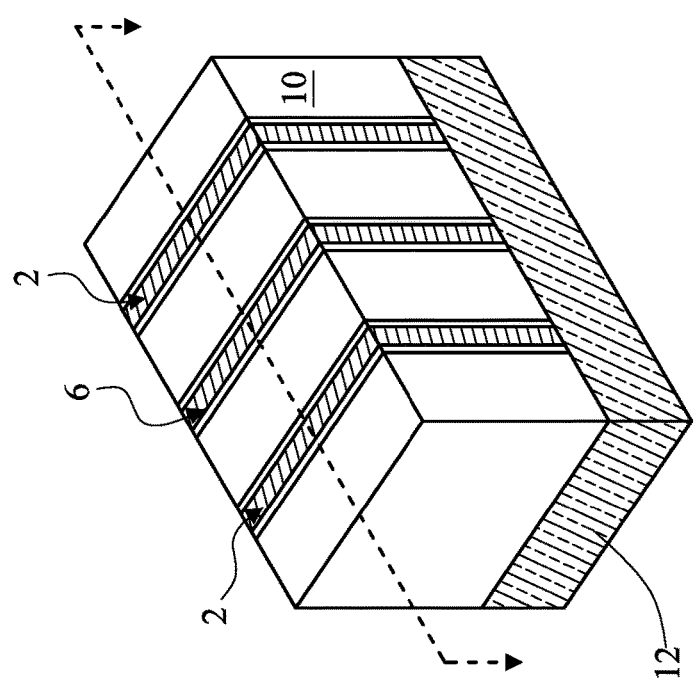
FIGS. 10a and 10b illustrate perspective view and cross-sectional view of an illustrative embodiment MOM capacitor structure.
Figure 10B:
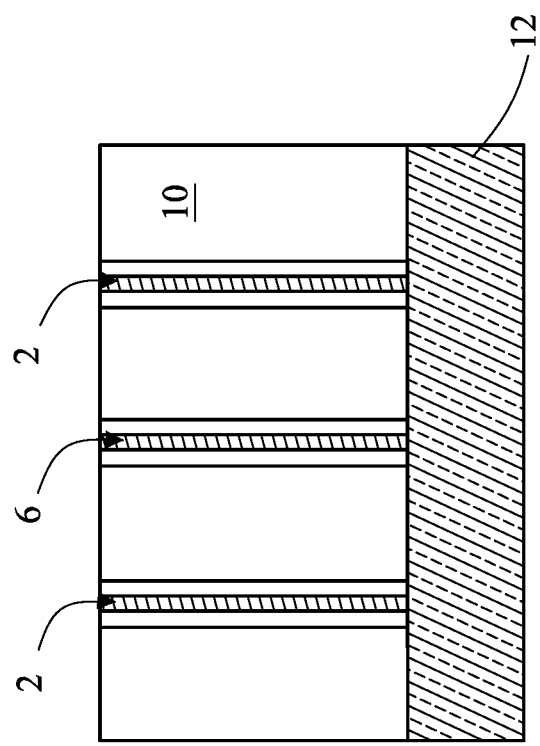

Yet another embodiment is illustrated in FIGS. 10a and 10b. This embodiment is similar to that illustrated in FIGS. 8a/8b and 9a/9b, except that in this embodiment fins 4 and 8 are removed completely, allowing recesses 23 to extend to the surface of substrate 12. Liner dielectric is formed on the sidewalls and bottoms of recesses 23, leaving recesses 25 within, which are in turn filled with conductive material to form electrodes 2 and 6, as shown in FIG. 10. By removing the fins 4, 8, the capacitor plates formed by electrodes 2, 6 are deeper and hence provide additional capacitive value.

In one aspect, embodiments described herein may provide for an integrated circuit comprising a capacitor. The capacitor includes a substrate, and a capacitor dielectric layer on a major surface of the substrate, the capacitor dielectric layer having a first recess and a second recess therein. The integrated circuit further includes a first semiconductor fin extending from the major surface of the substrate within the first recess, a first capacitor electrode within the first recess and atop the first semiconductor fin, a second semiconductor fin extending from the major surface of the substrate and within the second recess, and a second capacitor electrode within the second recess and atop the second semiconductor fin.

In another aspect, embodiments described herein may provide for an integrated circuit a dielectric layer having a first semiconductor fin therein and a second semiconductor fin therein, and a first recess in the dielectric layer above the first semiconductor fin and a second recess in the dielectric layer above the second semiconductor fin. The integrated circuit also includes a first electrode in the first recess above the first semiconductor fin and a second electrode physically isolated from the first electrode in the second recess above the second semiconductor fin, wherein no portions of the first electrode and the second electrode are disposed on sidewalls of the first semiconductor fin and the second semiconductor fin.

In yet another aspect, embodiments described herein may provide for an integrated circuit, comprising a substrate having a top major surface, and a capacitor dielectric layer above the top major surface of the substrate, the capacitor dielectric layer having a first, a second and a third recess extending from a topmost surface of the capacitor dielectric layer to the substrate, wherein the second recess is between the first and third recesses. The integrated circuit further includes a dielectric liner lining the first, the second and the third recesses, and a conductor material filling the lined first, second and third recesses, forming a first, a second and third electrode, respectively, the first, the second and the third electrodes extending substantially perpendicular to the top major surface of the substrate. A first conductive line extends over the capacitor dielectric layer and the first, second and third electrodes, the first conductive line being electrically connected to the first and third electrodes, and a second conductive line extends over the capacitor dielectric layer and the first, second and third electrodes, the second conductive line being electrically connected to the second electrode.

What is claimed is:

1. An integrated circuit comprising:
   a capacitor, the capacitor comprising:
      a substrate;
      a capacitor dielectric layer on a major surface of the substrate;
      a first semiconductor fin extending from the major surface of the substrate into the capacitor dielectric layer;
      a first capacitor electrode atop the first semiconductor fin;
      a second semiconductor fin extending from the major surface of the substrate into the capacitor dielectric layer, the capacitor dielectric layer having a first portion extending continuously from a sidewall of the first semiconductor fin to a sidewall of the second semiconductor fin; and
      a second capacitor electrode atop the second semiconductor fin, the second capacitor electrode being electrically insulated from the first capacitor electrode by the capacitor dielectric layer.

2. The integrated circuit of claim 1 further comprising:
   a third semiconductor fin extending from the major surface of the substrate into the capacitor dielectric layer, the capacitor dielectric layer having a second portion extending continuously from a sidewall of the second semiconductor fin to a sidewall of the third semiconductor fin; and
   a third capacitor electrode atop the third semiconductor fin,
   wherein the first and third capacitor electrodes are electrically connected to one another.

3. The integrated circuit of claim 1 further comprising:
   a first liner dielectric layer extending along sides of the first capacitor electrode and being disposed between the first semiconductor fin and the first capacitor electrode; and
   a second liner dielectric layer extending along sides of the second capacitor electrode and being disposed between the second semiconductor fin and the second capacitor electrode.

4. The integrated circuit of claim 3 wherein the first and second liner dielectric layers comprises silicon oxide or a high-k dielectric comprising a metal Oxide.

5. The integrated circuit of claim 1 wherein the first and second capacitor electrodes are both a material selected from a group consisting essentially of aluminum, copper, tungsten, titanium, a metal silicide, a conductive ceramic, doped silicon, and combinations thereof.

6. The integrated circuit of claim 1, wherein an interface between the first capacitor electrode and the capacitor dielectric layer is in the same plane as an interface between the first semiconductor fin and the capacitor dielectric layer, and wherein an interface between the second capacitor electrode and the capacitor dielectric layer is in the same plane as an interface between the second semiconductor fin and the capacitor dielectric layer.

7. The integrated circuit of claim 2, further comprising: a transistor, the transistor comprising:
a fourth semiconductor fin extending from the major surface of the substrate;
a gate dielectric on the fourth semiconductor fin;
a gate electrode on the gate dielectric;
a source region in the fourth semiconductor fin; and
a drain region in the fourth semiconductor fin.

8. An integrated circuit comprising:
a dielectric layer having a first semiconductor fin therein and a second semiconductor fin therein; and
a first electrode in the dielectric layer above the first semiconductor fin and a second electrode physically isolated from the first electrode in the dielectric layer above the second semiconductor fin, wherein no portions of the first electrode and the second electrode are disposed on sidewalls of the first semiconductor fin and the second semiconductor fin, wherein top surfaces of the dielectric layer, the first electrode, and the second electrode are level.

9. The integrated circuit of claim 8, wherein the first and second electrodes are formed of a material selected from a group consisting essentially of a metal, a metal alloy, a conductive ceramic, a silicide, a doped semiconductor, and combinations thereof.

10. The integrated circuit of claim 8 further comprising:
a third semiconductor fin in the dielectric layer; and
a third electrode in the dielectric layer above the third semiconductor fin, the third electrode being electrically connected to the first electrode, wherein top surfaces of the dielectric layer and the third electrode are level.

11. The integrated circuit of claim 10, further comprising:
a conductive line extending over the first, second, and third semiconductor fins;
a first conductive via electrically connecting the conductive line to the first electrode; and
a second conductive via electrically connecting the conductive line to the third electrode.

12. The integrated circuit of claim 11, further comprising:
a second conductive line extending over the first, second, and third semiconductor fins; and
a third conductive via electrically connecting the second conductive line to the second electrode.

13. The integrated circuit of claim 8, further comprising a finFET semiconductor fin in the dielectric layer, the finFET semiconductor fin having a finFET formed therein.

14. The integrated circuit of claim 13, further comprising:
a third semiconductor fin in the dielectric layer; and
a third electrode in the dielectric layer above the third semiconductor fin, the third electrode being electrically connected to the first electrode, wherein top surfaces of the dielectric layer and the third electrode are level.

15. The integrated circuit of claim 8, further comprising:
a dielectric liner around the first and second electrodes.

16. The integrated circuit of claim 15, wherein the dielectric liner is selected from a group consisting of silicon oxide or a metal oxide of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof.

17. An integrated circuit, comprising:
a substrate having a top major surface;
a capacitor dielectric layer above the top major surface of the substrate, the capacitor dielectric layer having a first, a second, and a third recess extending from a topmost surface of the capacitor dielectric layer to the substrate, wherein the second recess is between the first and third recesses;
a dielectric liner lining the first, the second, and the third recesses;
a conductor material filling the lined first, second, and third recesses, forming a first, a second, and third electrode, respectively, the first, the second, and the third electrodes extending substantially perpendicular to the top major surface of the substrate, the first and third electrodes being electrically insulated from the second electrode, the first, second, and third electrodes having top surfaces level with the topmost surface of the capacitor dielectric layer;
a first conductive line extending over the capacitor dielectric layer and the first, second, and third electrodes, the first conductive line being electrically connected to the first and third electrodes; and
a second conductive line extending over the capacitor dielectric layer and the first, second, and third electrodes, the second conductive line being electrically connected to the second electrode.

18. The integrated circuit of claim 17, further comprising a finFET fin extending from the top major surface of the substrate and a transistor formed in the finFET fin.

19. The integrated circuit of claim 17, wherein the dielectric liner is selected from a group consisting of silicon oxide or a metal oxide of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof.

20. The integrated circuit of claim 17, wherein liner dielectric has a thickness of from about 5 nm to about 15 nm.

* * * * *